United States Patent [19]

Matsusako et al.

[11] Patent Number: 5,489,793
[45] Date of Patent: Feb. 6, 1996

[54] SEMICONDUCTOR DEVICE HAVING AN EVALUATION DEVICE AND METHOD OF FABRICATING SAME

[75] Inventors: Takuo Matsusako; Kazumasa Satsuma, both of Itami, Japan

[73] Assignee: Mitsubishi Denki Kabushiki Kaisha, Tokyo, Japan

[21] Appl. No.: 272,285

[22] Filed: Jul. 8, 1994

Related U.S. Application Data

[63] Continuation of Ser. No. 970,397, Nov. 2, 1992, abandoned.

[30] Foreign Application Priority Data

Nov. 25, 1991 [JP] Japan ................................ 3-308946

[51] Int. Cl.⁶ .................... H01L 23/62; H01L 23/48; H01L 23/52
[52] U.S. Cl. .................... 257/355; 257/356; 257/754; 257/758; 257/773; 257/776; 257/784
[58] Field of Search ..................... 257/355, 356, 257/754, 758, 773, 776, 784

[56] References Cited

U.S. PATENT DOCUMENTS

| | | |
|---|---|---|
| 4,144,493 | 3/1979 | Lee et al. |
| 4,197,632 | 4/1980 | Aomura ................................ 29/574 |
| 4,283,733 | 8/1981 | Aomura ................................ 357/68 |
| 4,413,271 | 11/1983 | Gontowski, Jr. et al. |
| 5,055,715 | 10/1991 | Inaba ................................ 307/443 |
| 5,144,389 | 9/1992 | Nakamura et al. ................ 357/23.4 |

FOREIGN PATENT DOCUMENTS

| | | |
|---|---|---|
| 0278463A2 | 2/1988 | European Pat. Off. . |
| 48-21428 | 6/1973 | Japan . |

Primary Examiner—Rolf Hille
Assistant Examiner—Valencia Martin Wallace
Attorney, Agent, or Firm—Oblon, Spivak, McClelland, Maier & Neustadt

[57] ABSTRACT

There are provided a plurality of standard cell blocks (2) within an IC chip (1), and an aluminium wiring layer is formed in an aluminium wiring region (8) provided between the standard cell blocks (2) to electrically connect the standard cell blocks (2) to each other. An n-type epitaxial region (4), a p-type diffusion region (5) and an n-type diffusion region (6) are incorporated in an underlayer of the aluminium wiring region (8), to thereby form an evaluation device which is an npn bipolar transistor under the aluminium wiring region (8). A semiconductor device which is capable of accurately evaluating its finished product by the inspection of the evaluation device is provided without the damage of an integration level.

7 Claims, 16 Drawing Sheets

SEMICONDUCTOR DEVICE HAVING AN EVALUATION DEVICE AND METHOD OF FABRICATING SAME

This application is a continuation of application Ser. No. 07/970,397, filed on Nov. 2, 1992, now abandoned.

BACKGROUND OF THE INVENTION

1. Field of the Invention

The present invention relates to a semiconductor device which includes an extensive evaluation device constituted in a semiconductor substrate and a method of fabricating the same.

2. Description of the Background Art

Recently it has been a customary practice in the mass production of semiconductor devices to control a mass production line by evaluating the finish of produced semiconductor elements.

FIG. 22 illustrates a method of evaluating devices by means of TEGs (test element groups). Some TEGs 14 (e.g., three TEGs in FIG. 22) are suitably disposed on a mass-produced wafer 13. The TEGs 14 are adapted to be capable of measuring process parameters such as current amplification factor, resistance, breakdown voltage of pn junctions and threshold voltage of transistors. The finish of the semiconductor elements made on the wafer 13 is evaluated by the inspection of the TEGs 14.

FIG. 23 illustrates a method of evaluating devices by means of monitoring transistors. A single wafer process monitoring transistor 15 is incorporated in each integrated circuit (IC) chip 1 made on the wafer 13.

FIG. 24 illustrates the details of the IC chip 1 shown in FIG. 23. Wirings 18 make electrical connections between standard cell blocks 17 each of which is composed of a plurality of standard cells fabricated according to the standard cell approach. The monitoring transistor 15 is formed on the IC chip 1 in a region where the standard cell blocks 17 and wirings 18 are not formed. Electrodes of the monitoring transistor 15 are electrically connected to transistor evaluation pads 16 through monitoring wirings 19. The stylus of an external tester is brought into contact with the transistor evaluation pads 16 for the inspection of the characteristics of the monitoring transistor 15.

FIG. 25 is a plan view of the monitoring transistor 15, and FIG. 26 is a cross-sectional view taken along the line A—A of FIG. 25. Reference numeral 65 designates an n-type epitaxial region; 66 designates a p-type diffusion region; and 67 designates an n-type diffusion region. Thus the monitoring transistor 15 is an npn bipolar transistor which includes the n-type epitaxial region 65 serving as a collector, the p-type diffusion region 66 serving as a base and the n-type diffusion region 67 serving as an emitter. The finish of the semiconductor elements incorporated in the IC chip 1 is evaluated by the inspection of the electric characteristics of the sampled monitoring transistor.

The conventional semiconductor devices are, as above mentioned, provided with the TEGs for evaluating practical semiconductor elements on the IC chip and with the monitoring transistors.

However, the method in which the TEGs are incorporated in the wafer has a problem in that the fabrication scatter within the wafer surface is not considered in the evaluation.

The method in which the single monitoring transistor is mounted on each IC chip also has a problem. At LSI levels, since a thousand to a hundred thousand transistors are constituted on one IC chip, the monitoring transistors are too small in number as compared with the transistors to be actually fabricated to be used as satisfactory samples. This method has a limit in accurate evaluation of the practical semiconductor elements.

SUMMARY OF THE INVENTION

According to the present invention, a semiconductor device comprises a semiconductor substrate; a plurality of semiconductor elements formed in the semiconductor substrate; a metal wiring layer provided in a wiring region between the plurality of semiconductor elements for electrically connecting the plurality of semiconductor elements to each other; and an evaluation device formed under the wiring region in insulated relation to the metal wiring layer and being capable of inspecting an electric characteristic.

In the semiconductor device, the evaluation device is formed under the wiring region in insulated relation to the metal wiring layer. Because of a relatively large proportion of the wiring region in the semiconductor substrate, the whole evaluation device formed under the wiring region has a large area.

As a result, the evaluation device of the semiconductor device has a formation area enough to be used as a sample. The inspection of the evaluation device provides for the sufficiently reliable evaluation of the finish of the semiconductor device. Since the evaluation device is incorporated in the underlayer of the essential wiring region, the formation of the evaluation device does not destroy an integration level.

The present invention is also directed to a method of fabricating a semiconductor device. According to the present invention, the method comprises the steps of preparing a semiconductor substrate; separating a practical semiconductor element formation region and an evaluation device formation region from each other in the semiconductor substrate; forming a plurality of semiconductor elements in the practical semiconductor element formation region; forming an evaluation device capable of inspecting an electric characteristic in the evaluation device formation region; and forming a metal wiring layer electrically connecting the plurality of semiconductor elements to each other in electrically independent relation to the evaluation device in the evaluation device formation region.

In this method, the metal wiring layer is formed above the evaluation device formation region or in the wiring region. Since the evaluation device is formed under the wiring region in insulated relation to the metal wiring layer, the whole evaluation device formed under the wiring region has a large area.

As a result, the evaluation device of the semiconductor device which is fabricated in accordance with this method has the formation area enough to be used as a sample. The inspection of the evaluation device provides for the sufficiently reliable evaluation of the finish of the semiconductor device. Since the evaluation device is incorporated in the underlayer of the essential wiring region, the formation of the evaluation device does not destroy the integration level.

It is an object of the present invention to provide a semiconductor device which is capable of accurately evaluating its finish when formed in a semiconductor chip integrated at LSI levels and a method of fabricating the same.

These and other objects, features, aspects and advantages of the present invention will become more apparent from the

3 following detailed description of the present invention when taken in conjunction with the accompanying drawings.

DESCRIPTION OF THE PREFERRED EMBODIMENTS

Figure 1:
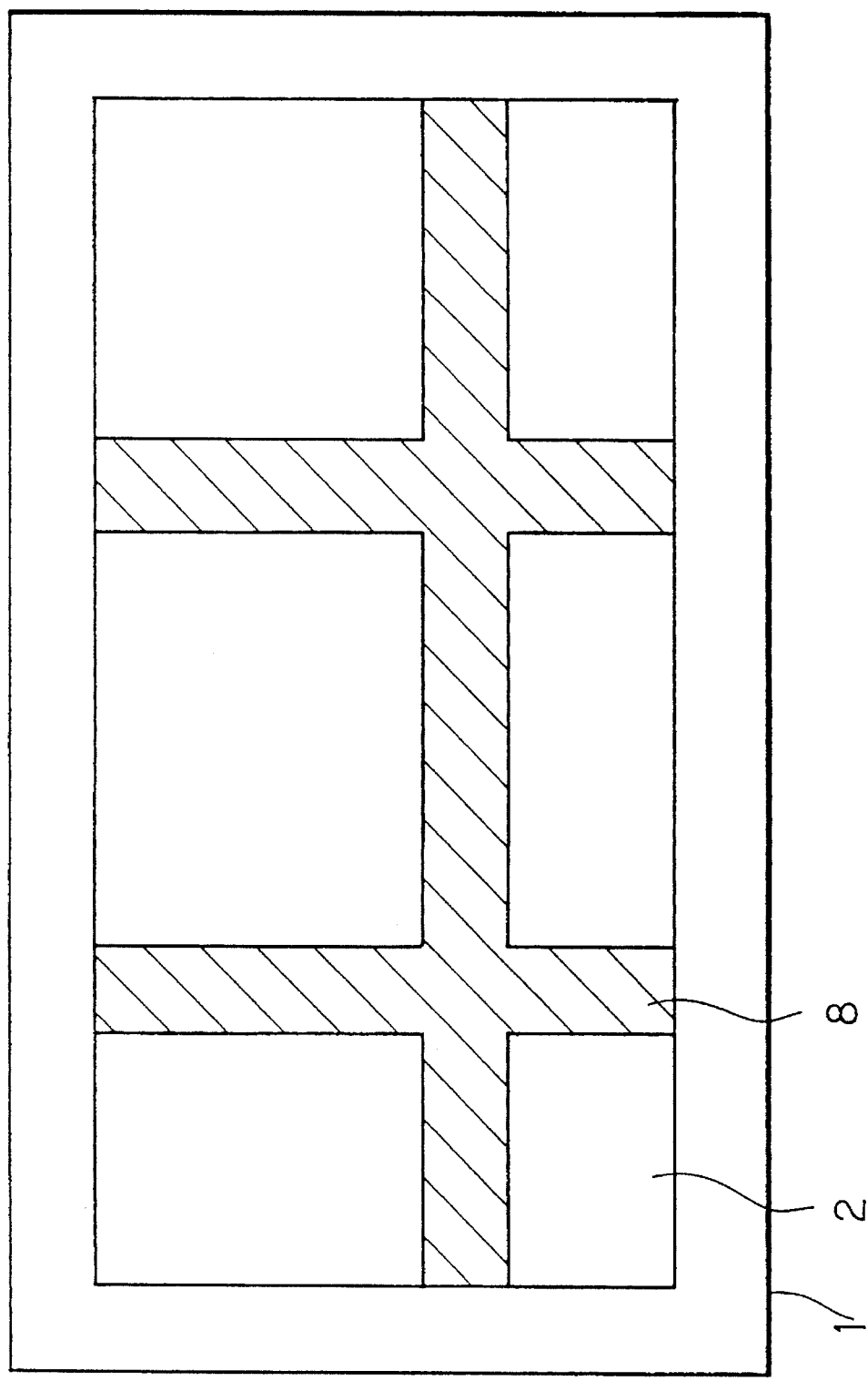
FIG. 1 is a plan view of a semiconductor device according to a first preferred embodiment of the present invention.

FIG. 1 is a plan view of a semiconductor device fabricated in conformity to the standard cell approach according to a first preferred embodiment of the present invention. There are provided a plurality of standard cell blocks 2 within an IC chip 1. An aluminium wiring layer (not shown) is formed in an aluminium wiring region 8 provided between the standard cell blocks 2 to electrically connect the standard cell blocks 2 to each other.

Figure 2:
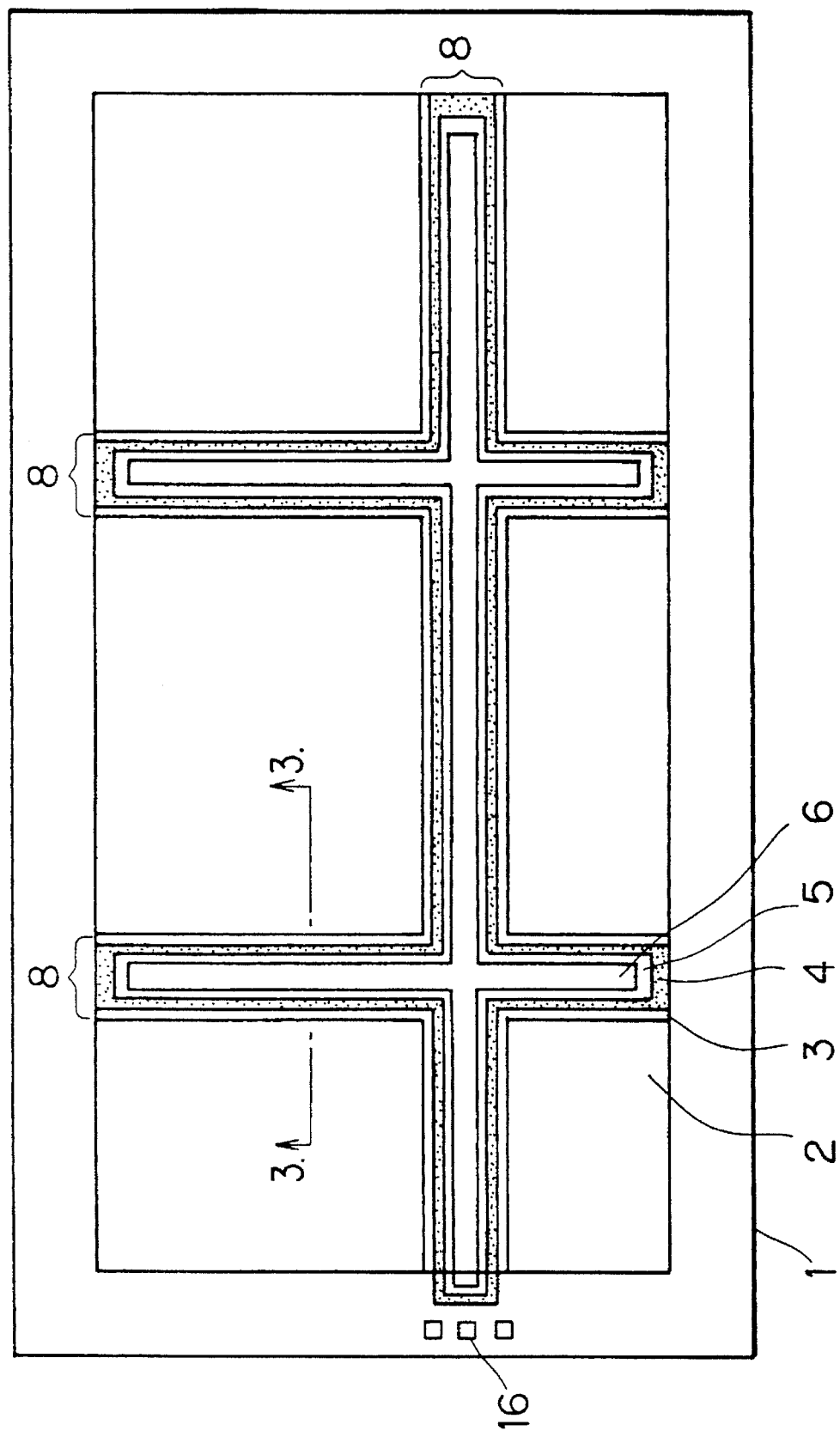
FIG. 2 is a schematic plan view of an evaluation transistor for the semiconductor device of the first preferred embodiment.
Figure 3:
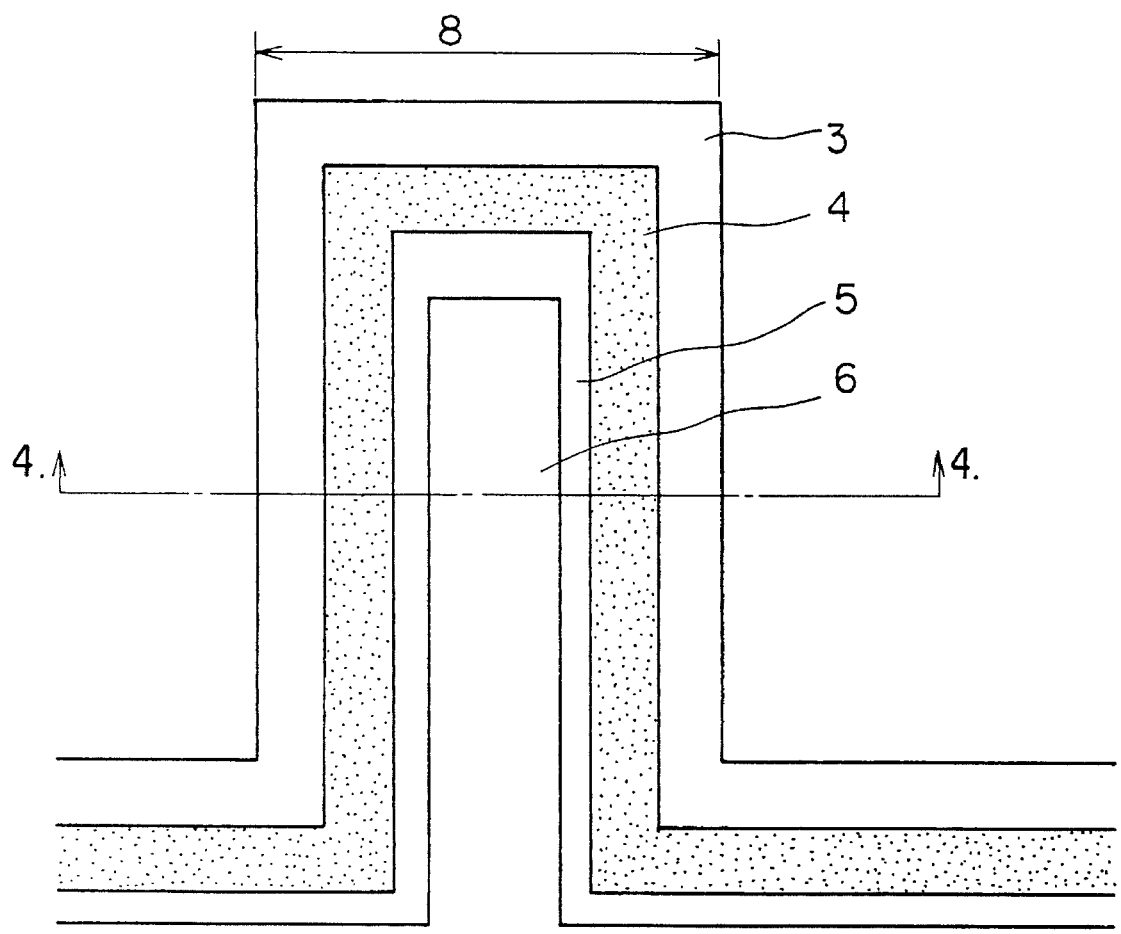
FIG. 3 is a schematic plan view showing the vicinity of the line B—B of FIG. 2.
Figure 4:
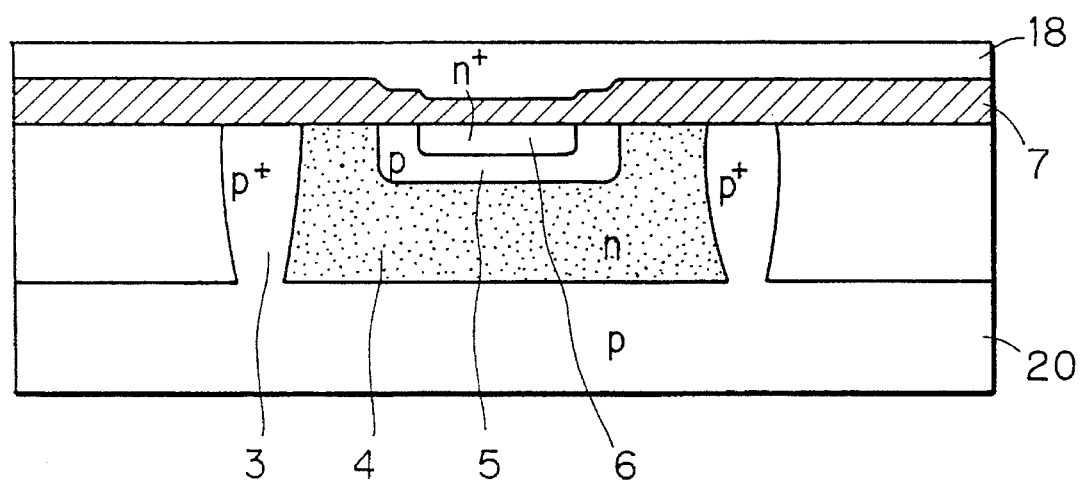
FIG. 4 is a cross-sectional view taken along the line B—B of FIG. 2.

FIG. 2 is a schematic plan view of an underlayer portion of the aluminium wiring region 8 in the semiconductor device of FIG. 1. FIG. 3 is a schematic plan view showing the vicinity of the line B—B of FIG. 2. FIG. 4 is a cross-sectional view taken along the line B—B of FIGS. 2 and 3. With reference to FIGS. 2 to 4, there is formed a p-type isolation region 3 in an outer peripheral region under the aluminium wiring region 8 (or the aluminium wiring layer 18), and there is formed an n-type epitaxial region 4 in the inner periphery of the p-type isolation region 3. A p-type diffusion region 5 is formed in the inner peripheral surface of the n-type epitaxial region 4, and an n-type diffusion region 6 is formed in the inner peripheral surface of the

4 p-type diffusion region 5. Reference numeral 20 designates a p-type substrate and 7 designates an oxide film.

Thus an npn bipolar transistor which includes the n-type epitaxial region 4 serving as a collector, the p-type diffusion region 5 serving as a base and the n-type diffusion region 6 serving as an emitter is formed as an evaluation device under the aluminium wiring region 8.

Figure 5:
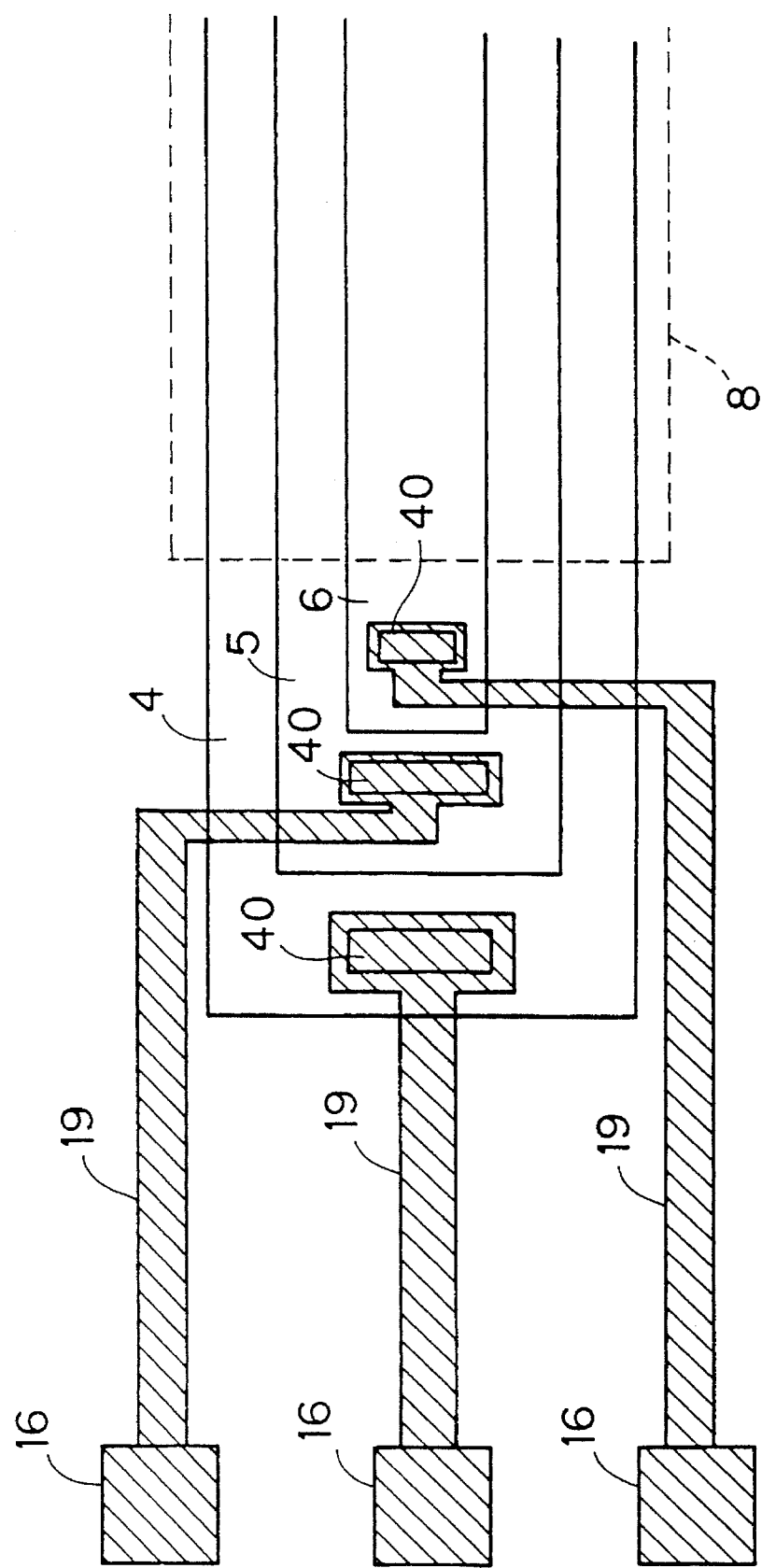
FIG. 5 is a schematic plan view showing the vicinity of evaluation pads for the semiconductor device of the first preferred embodiment.

FIG. 5 is a plan view showing electrical connections between the electrode regions 4 to 6 of the evaluation bipolar transistor and evaluation pads 16. The electrode regions 4 to 6 are formed such that they protrude from the underlayer of the aluminium wiring region 8. Contact holes 40 are formed respectively in the protrusive parts of the electrode regions 4 to 6. Aluminium wiring layers 19 are formed for the electrical connections between the evaluation pads 16 and the electrode regions 4 to 6 through the contact holes 40.

FIGS. 6 to 9 are cross-sectional views showing a method of fabricating the semiconductor device of the first preferred embodiment. Referring to FIGS. 6 to 9, the method will be described hereinafter.

Figure 6:
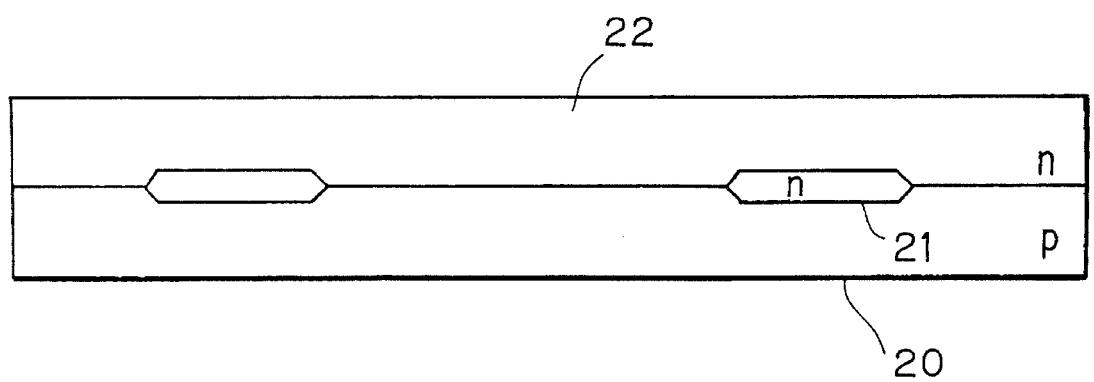
FIGS. 6 to 9 are cross-sectional views showing a method of fabricating the semiconductor device of the first preferred embodiment.

Reference is made initially to FIG. 6. Antimony is thermally diffused selectively in the surface of the p-type substrate 20 to form n-type buried layers 21. An n-type epitaxial layer 22 is formed by the epitaxial growth technique over the p-type substrate 20 and n-type buried layers 21.

Figure 7:
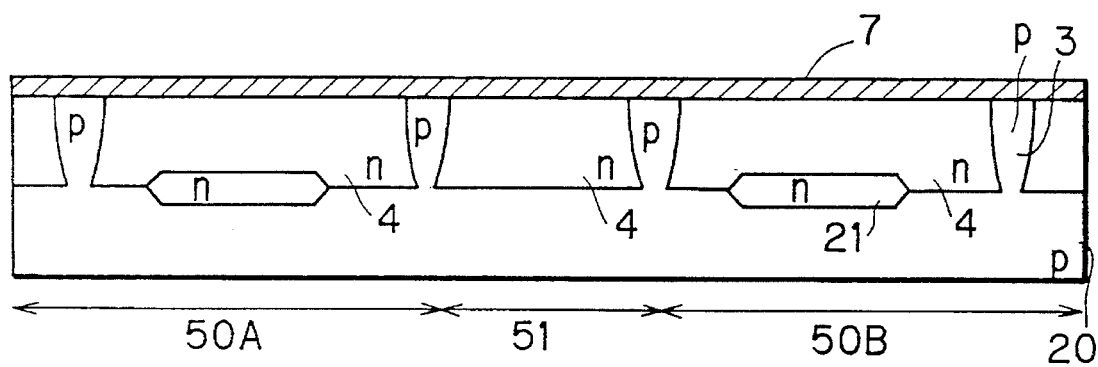

As shown in FIG. 7, boron is thermally diffused selectively to form the p-type isolation regions 3 selectively in the n-type epitaxial layer 22. The p-type isolation regions 3 separate the n-type epitaxial layer 22 into the n-type epitaxial regions 4 which are islands of the n-type epitaxial layer 22 in practical transistor formation regions 50 (50A and 50B) and in an evaluation transistor formation region 51. Subsequently, the oxide film 7 is formed all over.

Figure 8:
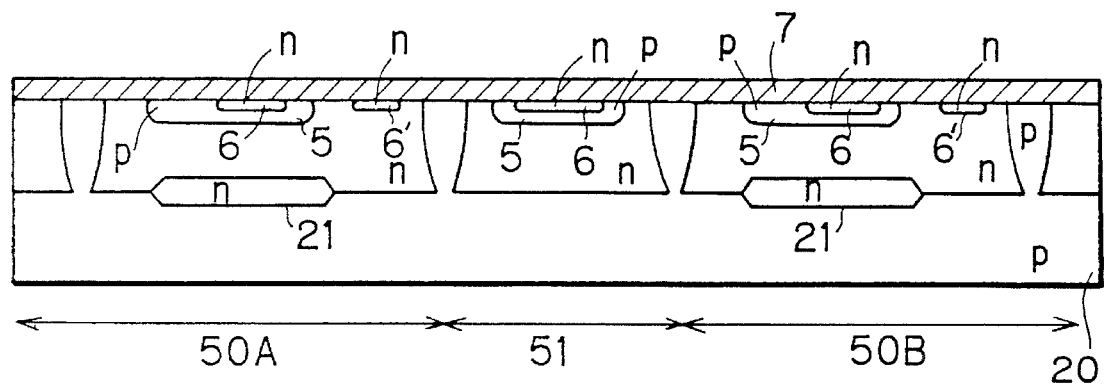

In FIG. 8, boron is thermally diffused selectively in the surface of the n-type epitaxial regions 4 to form the p-type diffusion regions 5. Phosphorus is thermally diffused selectively in the surfaces of the n-type epitaxial regions 4 and p-type diffusion regions 5 to form n-type diffusion regions 6 and 6', respectively.

Figure 9:
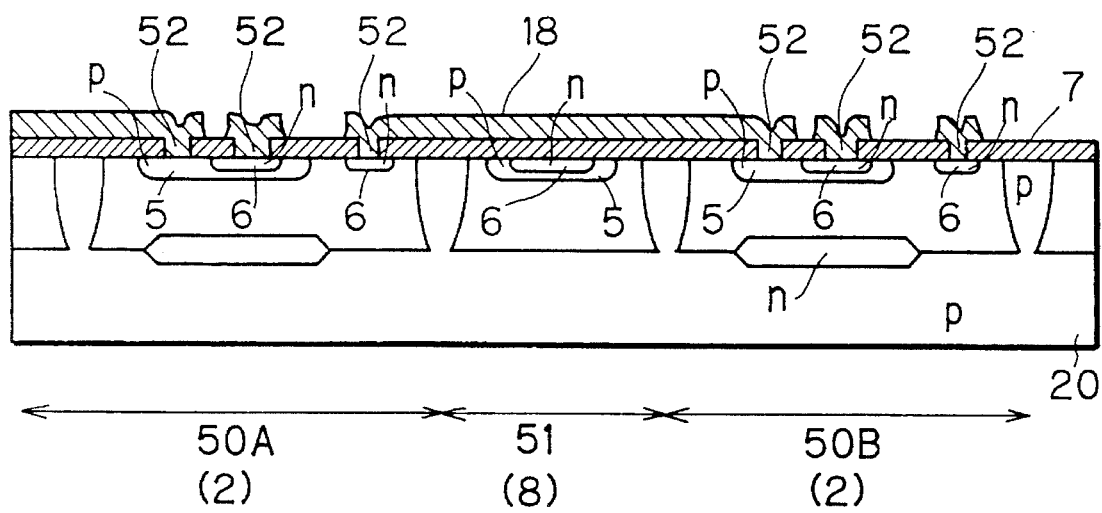

Contact holes 52 are formed in the oxide film 7 above the p-type diffusion regions 5 and n-type diffusion regions 6 and 6' which are formed in the practical transistor formation regions 50A and 50B, as shown in FIG. 9. The contact holes 40 for the evaluation transistor shown in FIG. 5 are formed at the same time. An aluminium layer is formed all over and, thereafter, is patterned to form the aluminium wiring layer 18. The aluminium wiring layers 19 and evaluation pads 16 shown in FIG. 5 are formed at the same time.

As a result, practical npn bipolar transistors which are electrically connected to each other by the aluminium wiring layer 18 are formed in the practical transistor formation regions 50. An evaluation npn bipolar transistor which is electrically connected to the evaluation pads 16 by the aluminium wiring layers 19 is formed in the evaluation transistor formation region 51.

The aluminium wiring layer 18 formed in the evaluation transistor formation region 51 makes the electrical connection between the npn bipolar transistor formed in the practical transistor formation region 50A and the npn bipolar transistor formed in the practical transistor formation region 50B. The practical transistor formation regions 50A and 50B are equivalent to the different standard cell blocks 2 of FIG. 1, and the evaluation transistor formation region 51 is equivalent to the aluminium wiring region 8 of FIG. 1.

The area of the evaluation npn bipolar transistor is approximately equal to that of the aluminium wiring region 8. Because of a large proportion of the aluminium wiring region 8 for wiring between the cell blocks in the IC chip 1, the evaluation npn bipolar transistor has a formation area enough to be used as a sample. As a result, the inspection of the evaluation bipolar transistors provides for the sufficiently reliable evaluation of the practical transistors.

Since the evaluation bipolar transistor is formed under the essential aluminium wiring region 8, the formation of the evaluation bipolar transistor does not destroy the integration level of the IC chip 1.

Figure 10:
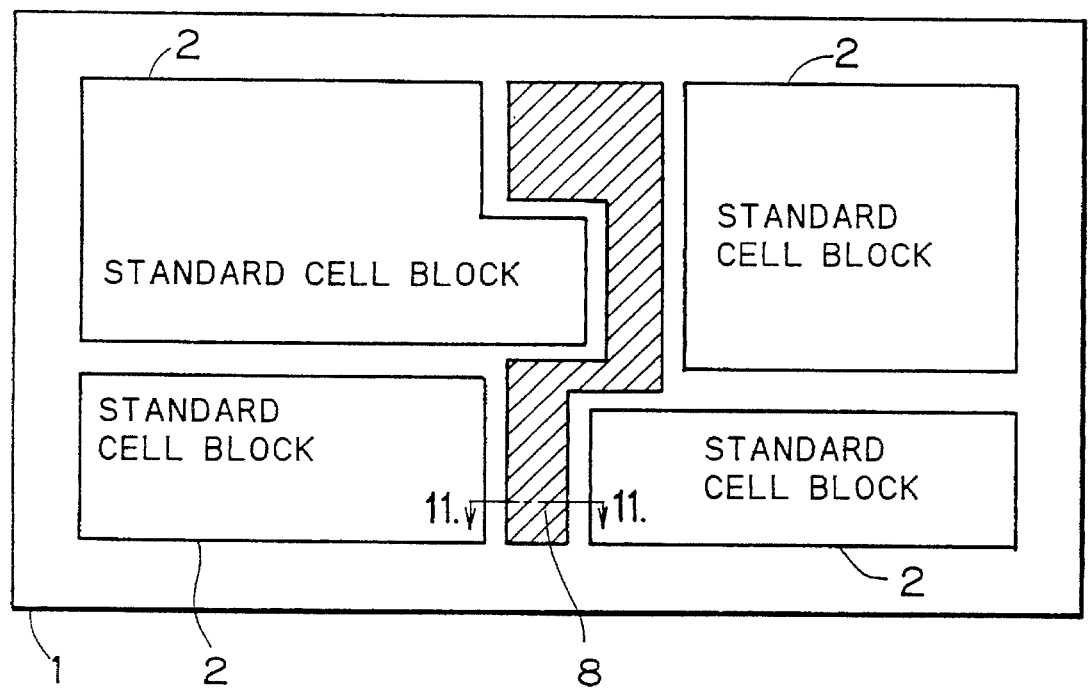
FIG. 10 is a plan view of the semiconductor device according to a second preferred embodiment of the present invention.

FIG. 10 is a plan view of the semiconductor device fabricated in conformity to the standard cell approach according to a second preferred embodiment of the present invention. Similarly to the first preferred embodiment, the plurality of standard cell blocks 2 are provided within the IC chip 1. The aluminium wiring layer (not shown) is formed in the aluminium wiring region 8 provided between the standard cell blocks 2 to electrically connect the standard cell blocks 2 to each other. An evaluation diode (not shown) is formed under the aluminium wiring region 8.

Figure 11:
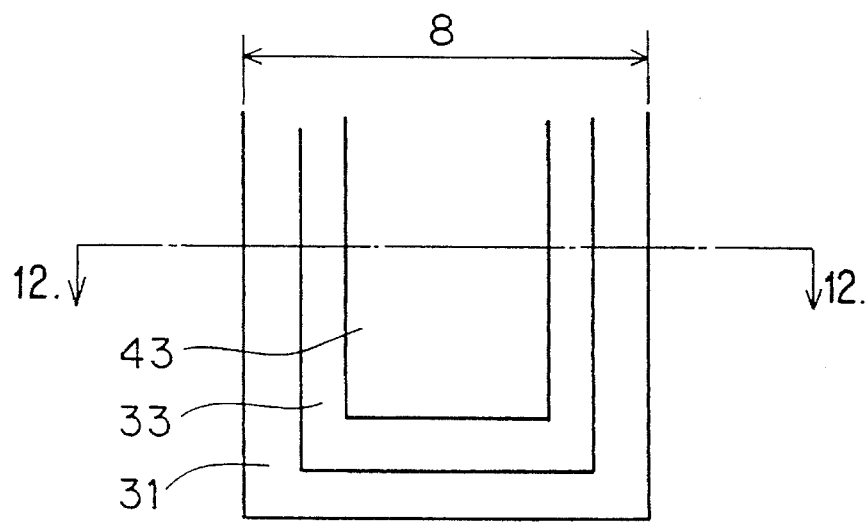
FIG. 11 is a schematic plan view of an evaluation diode according to the second preferred embodiment.
Figure 12:
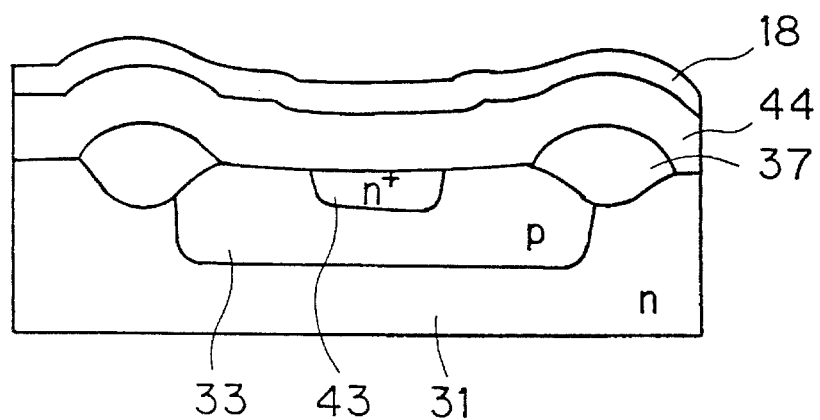
FIG. 12 is a cross-sectional view taken along the line C—C of FIG. 11.

FIG. 11 is a plan view showing the plan structure of the evaluation diode, and FIG. 12 is a cross-sectional view taken along the line C—C of FIG. 11. Referring to FIGS. 11 and 12, a p-type well region 33 is formed in the surface of an n-type silicon substrate 31 under the aluminium wiring region 8 (or the aluminium wiring layer 18). An n-type diffusion region 43 is formed selectively in the surface of the p-type well region 33. Reference numeral 37 designates a field oxide film, and 44 designates an interlayer insulator film.

Thus a diode which includes the p-type well region 33 serving as an anode and the n-type diffusion region 43 serving as a cathode is formed as the evaluation device under the aluminium wiring region 8.

FIGS. 13 to 21 are cross-sectional views showing a method of fabricating the semiconductor device of the second preferred embodiment. Referring to FIGS. 13 to 21, the method will be described hereinafter.

Figure 13:
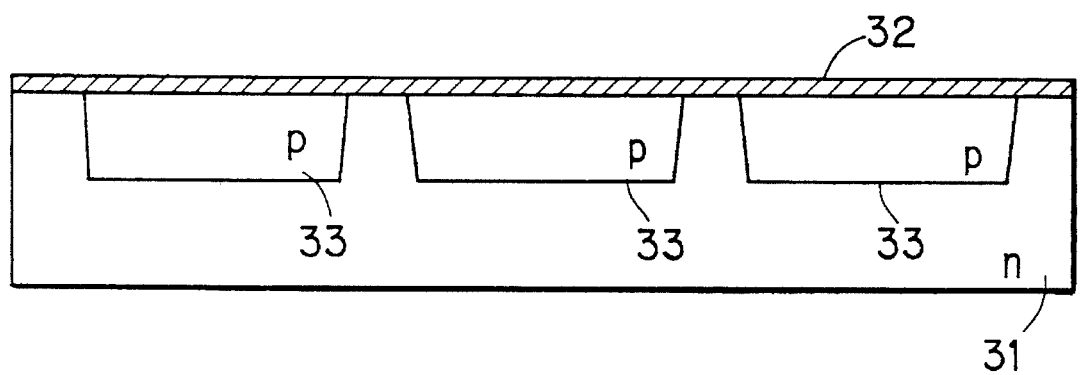
FIGS. 13 to 21 are cross-sectional views showing a method of fabricating the semiconductor device of the second preferred embodiment.

Reference is made initially to FIG. 13. An oxide film 32 is formed over the n-type silicon substrate 31. Boron is selectively implanted from above the oxide film 32 into the n-type silicon substrate 31 and is driven in, so that the p-type well regions 33 are formed selectively.

Figure 14:
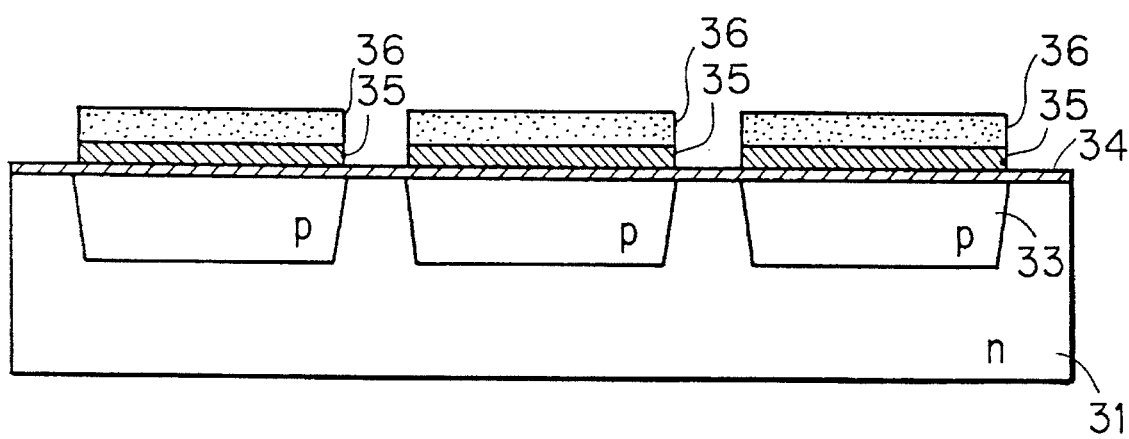

As shown in FIG. 14, the entire oxide film 32 is removed and a buffer oxide film 34 is formed all over. A nitride film 35 which is less susceptible to oxidation is deposited on the oxide film 34, and is then coated with resist 36 thereon. The resist 36 is patterned by using a predetermined pattern. Etching is performed using the patterned resist 36 as a mask to pattern the nitride film 35.

Figure 15:
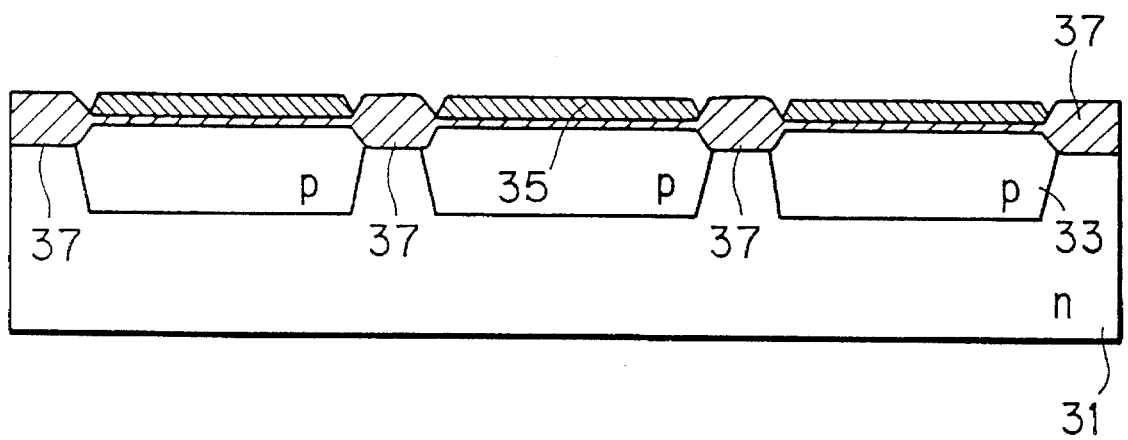
Figure 16:
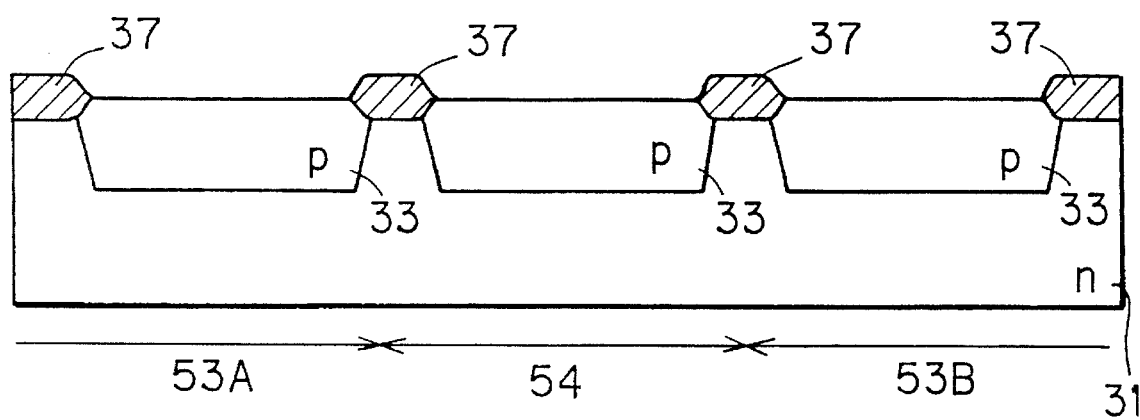

Referring to FIG. 15, high temperature treatment is performed using the nitride film 35 as a mask to form the field oxide films 37, whereby LOCOS isolation is carried out. The buffer oxide film 34 and nitride film 35 are removed as shown in FIG. 16. As a result, there are provided practical transistor formation regions 53 (53A and 53B) and an evaluation diode formation region 54 which are separated from each other.

Figure 17:
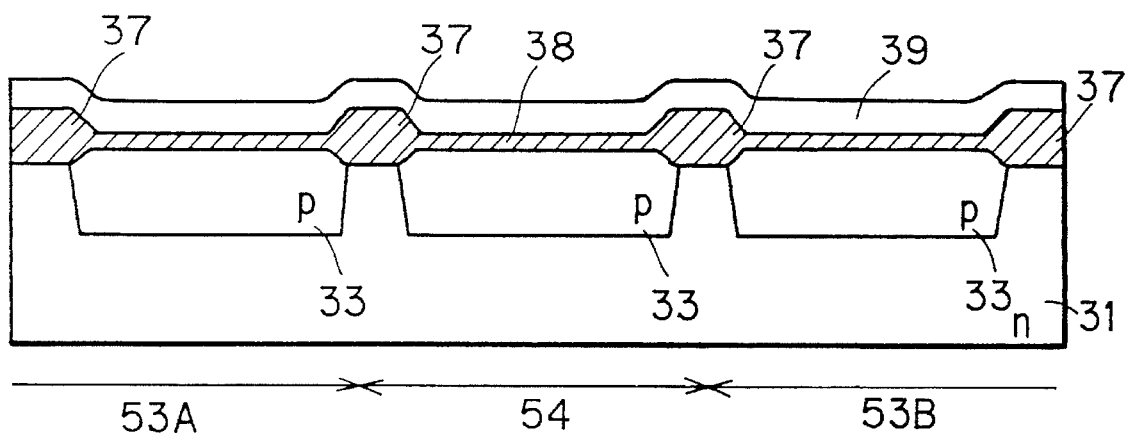
Figure 18:
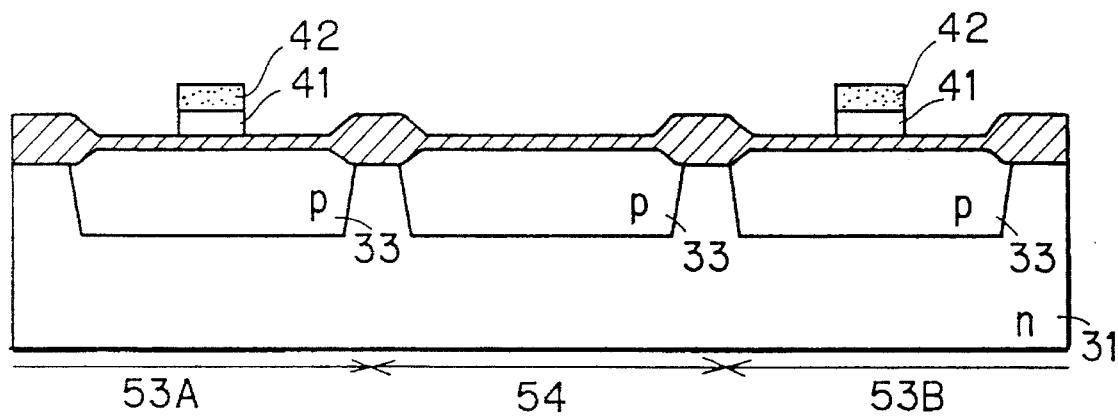

As shown in FIG. 17, gate oxide films 38 are formed on the surface of the p-type well regions 33, and a polysilicon layer 39 is formed all over. In FIG. 18, the polysilicon layer 39 is coated with resist 42, which is patterned by using a predetermined pattern. Etching is performed using the patterned resist 42 as a mask, so that gate electrodes 41 are formed on the gate oxide films 38 in the practical transistor formation regions 53A and 53B. The gate electrode 41 is not formed on the gate oxide film 38 in the evaluation diode formation region 54.

Figure 19:
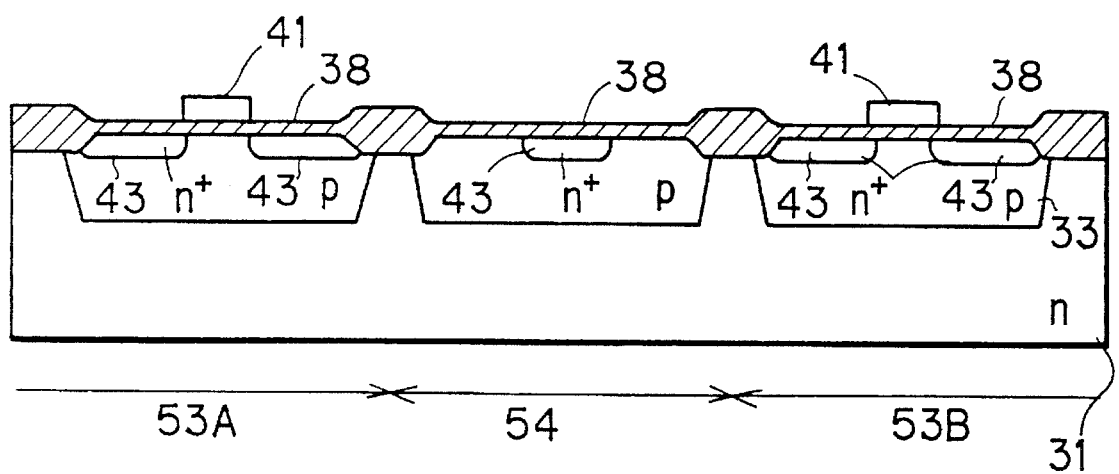

In FIG. 19, arsenic is implanted selectively into the silicon substrate 31 by ion implantation technique and is driven in, so that the n-type diffusion regions 43 of high concentration are selectively formed in the surface of the p-type well regions 33 in the practical transistor formation regions 53A, 53B and in the evaluation diode formation region 54.

Figure 20:
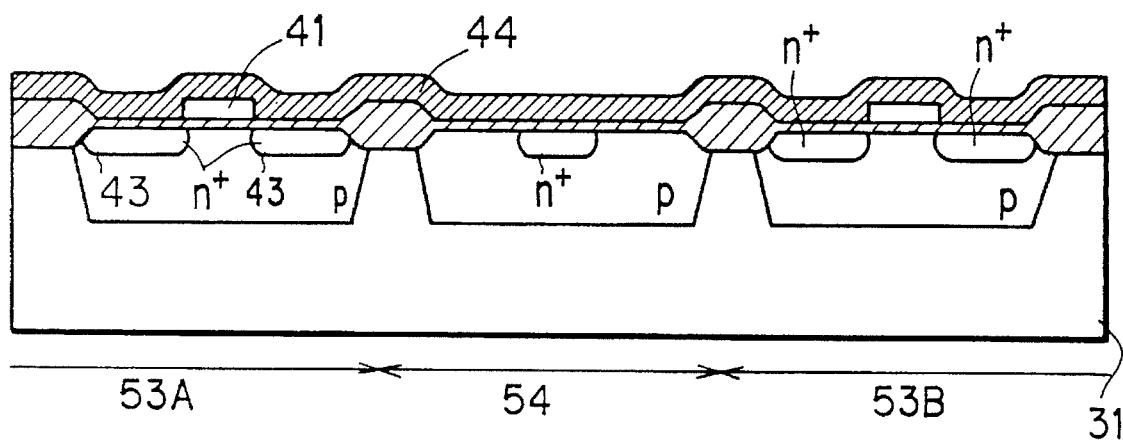
Figure 21:
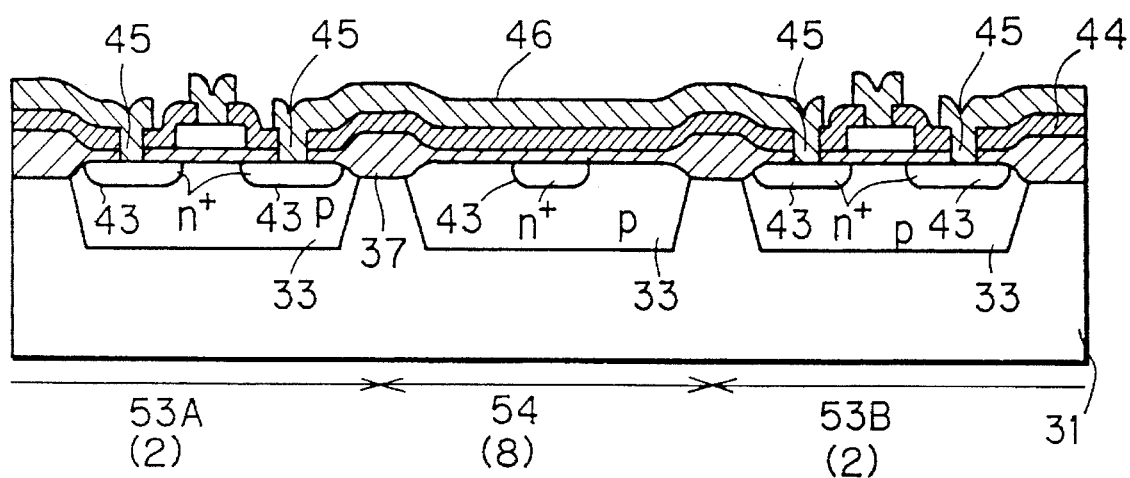
Figure 22:
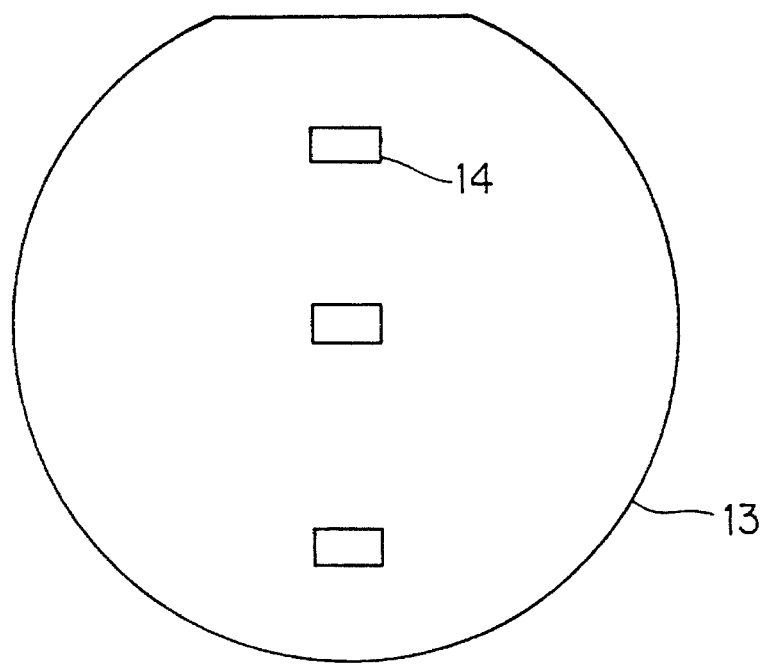
FIG. 22 conceptionally shows the surface of a conventional wafer having TEGs.
Figure 23:
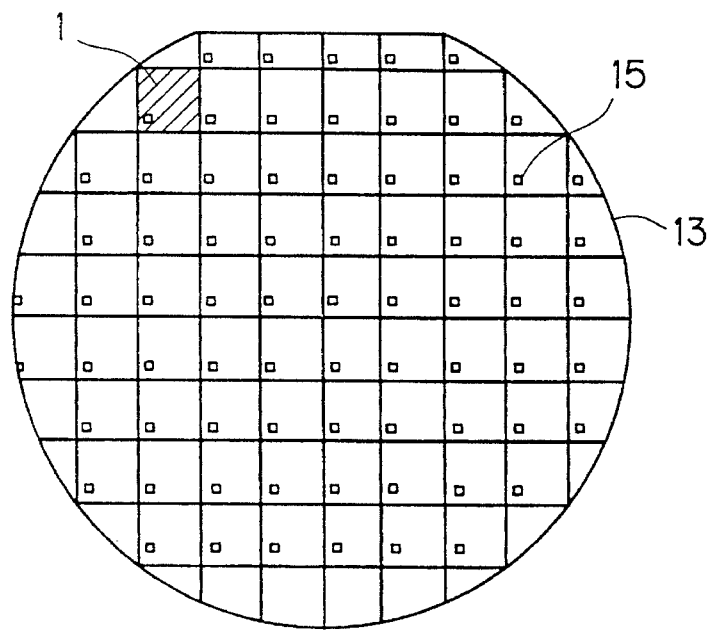
FIG. 23 conceptionally shows the surface of a conventional wafer having evaluation transistors.
Figure 24:
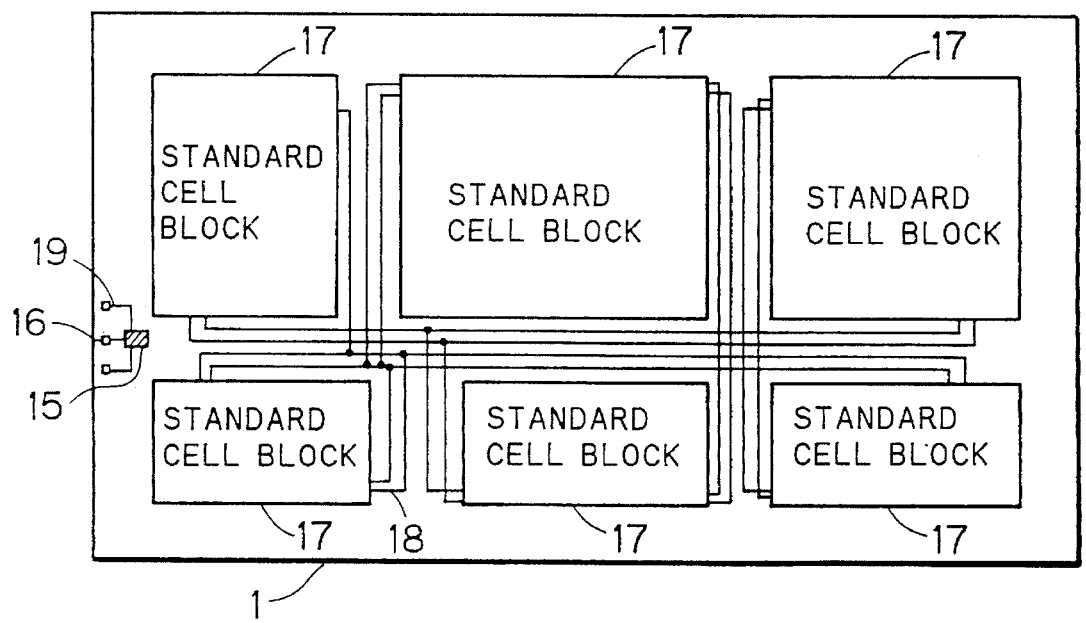
FIG. 24 conceptionally shows the surface of an IC chip of FIG. 22 in detail.
Figure 25:
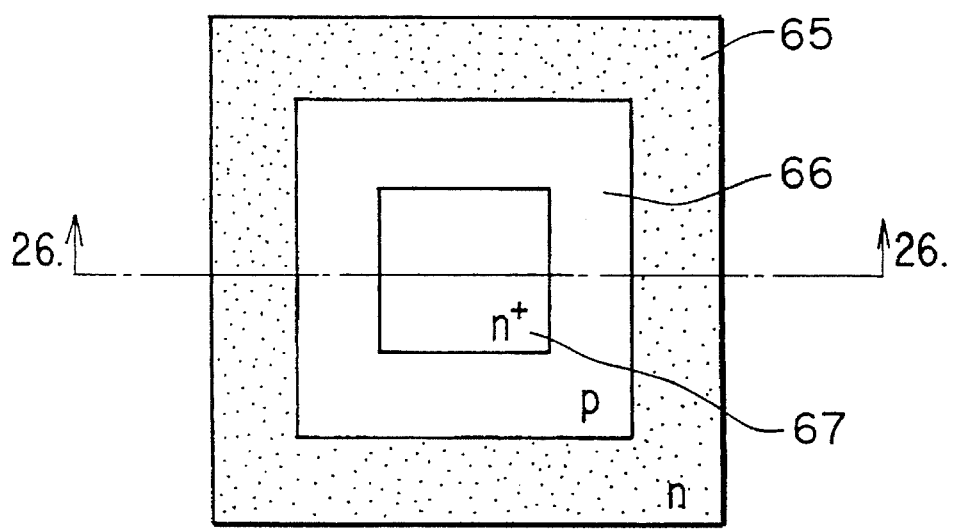
FIG. 25 is a plan view of the evaluation transistor of FIG. 23.
Figure 26:
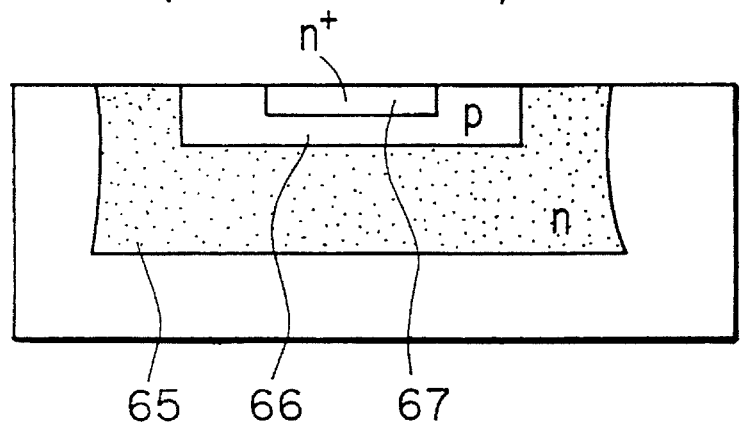
FIG. 26 is a cross-sectional view taken along the line A—A of FIG. 24.

The interlayer insulator film 44 is deposited all over as shown in FIG. 20. Thereafter, contact holes 45 are formed selectively on the n-type diffusion regions 43 which are formed in the practical transistor formation regions 53A and 53B, as shown in FIG. 21. An aluminium layer is formed all over and, subsequently, is patterned to form an aluminium wiring layer 46.

As a result, n-type MOS transistors which are electrically connected to each other by the aluminium wiring layer 46 and which include the n-type diffusion regions 43 serving as drain and source regions are formed in the practical transistor formation regions 53A and 53B. An evaluation diode composed of a pn junction of the p-type well region 33 and n-type diffusion region 43 is formed in the evaluation diode formation region 54. The p-type well region 33 and n-type diffusion region 43 in the evaluation diode formation region 54 are electrically connected to the evaluation pads not shown, similarly to the first preferred embodiment. That is, the p-type well region 33 and n-type diffusion region 43 are formed such that they protrude from the underlayer of the aluminium wiring region 8. The contact holes are formed in the interlayer insulator film 44 above the protrusive parts of the p-type well region 33 and n-type diffusion region 43. Another aluminium wiring layer independent of the aluminium wiring layer 46 is formed between the contact holes and the evaluation pads for the foregoing electrical connection.

The aluminium wiring layer 46 formed in the evaluation diode formation region 54 makes the electrical connection between the NMOS transistor formed in the practical transistor formation region 53A and the NMOS transistor formed in the practical transistor formation region 53B. The practical transistor formation regions 53A and 53B are equivalent to the different standard cell blocks 2 of FIG. 10, and the evaluation diode formation region 54 is equivalent to the aluminium wiring region 8 of FIG. 10.

Since the area of the evaluation diode is approximately equal to that of the aluminium wiring region 8, the inspection of the evaluation diodes provides for the sufficiently reliable evaluation of the practical transistors, similarly to the first preferred embodiment.

The evaluation devices such as transistors and diodes may be incorporated in the IC chip as far as the aluminium wiring region 8 has a minimum width required for the formation of the evaluation device. The evaluation devices are not limited to the transistors and diodes but may be resistors made of metal layers and the like. Variations in the type of evaluation device and in pattern size in accordance with the contents to be evaluated permit the evaluation of the semiconductor devices which are fit for the purpose.

In the first and second preferred embodiments, the electrical connection between the evaluation pads and the evaluation device is made such that part of the evaluation device is made to protrude from the underlayer of the aluminium wiring region 8 and the wiring layer between the evaluation pads and the evaluation device is formed outside the underlayer of the aluminium wiring region 8. The present invention is not limited to this. The electrical connection between the evaluation pads and the evaluation device may be made by forming a wiring layer independent of the aluminium wiring layer 18 above the aluminium wiring region 8 by means of the multilayer interconnection technique.

The present invention is not limited to the semiconductor devices fabricated according to the standard cell approach but may be applicable to any semiconductor device which includes a wiring region having a width enough to form the evaluation device.

In the first and second preferred embodiments, the one relatively large evaluation device is incorporated in the underlayer of the aluminium wiring region 8. The present invention, however, is not limited to this but may be structured such that the underlayer region of the aluminium wiring region 8 is divided into a plurality of regions, in which the evaluation devices are respectively incorporated.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate;

a plurality of transistor elements formed in said semiconductor substrate;

a metal wiring layer provided in a wiring region between said plurality of transistor elements for electrically connecting said plurality of transistor elements to each other;

an evaluation pad to be monitored formed on said semiconductor substrate independently of said metal wiring layer;

an insulator film formed under said wiring region; and an evaluation element to be monitored formed under said wiring region and said insulator film and having an electrode region, said electrode region being capable of making electrical contact with said evaluation pad.

2. The semiconductor device of claim 1, further comprising an evaluation metal wiring layer electrically connected to said electrode region and said evaluation pad independently of said metal wiring layer.

3. The semiconductor device of claim 2, wherein said plurality of transistor elements are provided in a standard cell block composed of a plurality of standard cells, and said metal wiring layer is a cell block wiring layer between said standard cell blocks.

4. The semiconductor device of claim 3, wherein said evaluation element is a bipolar transistor.

5. The semiconductor device of claim 3, wherein said evaluation element is a diode.

6. The semiconductor device of claim 3, wherein said plurality of transistor elements are bipolar transistors.

7. The semiconductor device of claim 3, wherein said plurality of transistor elements are MOS transistors.

\* \* \* \* \*